(12) United States Patent
Choe et al.

(10) Patent No.: US 12,382,670 B2
(45) Date of Patent: Aug. 5, 2025

(54) THIN FILM STRUCTURE AND SEMICONDUCTOR DEVICE COMPRISING THE SAME

(71) Applicant: Samsung Electronics Co., Ltd., Suwon-si (KR)

(72) Inventors: Dukhyun Choe, Suwon-si (KR); Hyangsook Lee, Suwon-si (KR); Junghwa Kim, Yongin-si (KR); Eunha Lee, Seoul (KR); Sanghyun Jo, Seoul (KR); Jinseong Heo, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 223 days.

(21) Appl. No.: 17/459,529

(22) Filed: Aug. 27, 2021

(65) Prior Publication Data
US 2022/0140147 A1    May 5, 2022

(30) Foreign Application Priority Data

Nov. 4, 2020  (KR) .................. 10-2020-0146371
Mar. 18, 2021  (KR) .................. 10-2021-0035345

(51) Int. Cl.
  *H10D 62/40*    (2025.01)
  *H10D 30/01*    (2025.01)
  (Continued)

(52) U.S. Cl.
CPC ....... *H10D 30/701* (2025.01); *H10D 30/0415* (2025.01); *H10D 30/67* (2025.01); *H10D 62/40* (2025.01); *H10D 64/689* (2025.01)

(58) Field of Classification Search
CPC . H01L 29/78391; H01L 29/04; H01L 29/516; H01L 29/6684; H01L 29/786;
(Continued)

(56) References Cited

U.S. PATENT DOCUMENTS 6,214,712 B1    4/2001  Norton
6,348,373 B1    2/2002  Ma et al.
(Continued)

FOREIGN PATENT DOCUMENTS

JP    2004-292239 A    10/2004
JP    5636575 B2    12/2014
(Continued)

OTHER PUBLICATIONS

T.S. Boscke, et al. "Ferroelectricity in hafnium oxide thin films," Applied Physics Letters, No. 99, 102903, pp. 1-4 (2011).
(Continued)

*Primary Examiner* — Sheikh Maruf
(74) *Attorney, Agent, or Firm* — Harness, Dickey & Pierce, P.L.C.

(57) ABSTRACT

A thin film structure includes a substrate; and a material layer having a fluorite structure, the material layer on the substrate and comprising crystals of which <112> crystal orientation is aligned in a normal direction of the substrate. The material layer may have ferroelectricity. The material layer may include the crystals of which the <112> crystal orientation is aligned in the normal direction of the substrate among all crystals of the material layer in a dominant ratio.

20 Claims, 10 Drawing Sheets
(1 of 10 Drawing Sheet(s) Filed in Color)

(51) Int. Cl.
*H10D 30/67* (2025.01)
*H10D 30/69* (2025.01)
*H10D 64/68* (2025.01)

(58) Field of Classification Search
CPC .. H01L 29/40111; H01L 29/785; H01L 28/40; H10B 53/30; C23C 16/405; H10D 30/701; H10D 30/0415; H10D 30/67; H10D 62/40; H10D 64/689; H10D 30/62; H10D 1/68; H10D 64/033
USPC ........................................... 257/295
See application file for complete search history.

(56) References Cited

U.S. PATENT DOCUMENTS

| | | | |
|---|---|---|---|
| 6,458,741 B1 * | 10/2002 | Roark | C01B 3/58 |
| | | | 502/308 |
| 6,716,795 B2 | 4/2004 | Norton et al. | |
| 7,709,359 B2 | 5/2010 | Boescke et al. | |
| 7,713,640 B2 | 5/2010 | Zurbuchen | |
| 8,154,002 B2 | 4/2012 | Lieber et al. | |
| 9,576,801 B2 | 2/2017 | Li et al. | |
| 9,735,258 B2 | 8/2017 | Balakrishnan et al. | |
| 9,793,397 B1 | 10/2017 | Ando et al. | |
| 9,978,868 B2 | 5/2018 | Lai et al. | |
| 10,403,721 B2 | 9/2019 | Liu et al. | |
| 10,475,653 B2 | 11/2019 | Yoo | |
| 11,145,731 B2 | 10/2021 | Moon et al. | |
| 2002/0009408 A1 * | 1/2002 | Wieland | C01B 3/382 |
| | | | 423/418.2 |
| 2003/0116472 A1 * | 6/2003 | Wieland | C01B 3/323 |
| | | | 208/138 |
| 2003/0148881 A1 * | 8/2003 | Matsuo | B01J 35/733 |
| | | | 502/300 |
| 2003/0166987 A1 * | 9/2003 | Roark | B01J 23/63 |
| | | | 588/316 |
| 2004/0063577 A1 * | 4/2004 | Wieland | C01B 3/40 |
| | | | 423/652 |
| 2007/0049051 A1 * | 3/2007 | Ahn | C23C 16/40 |
| | | | 257/E21.639 |
| 2008/0001172 A1 * | 1/2008 | Karg | H10N 70/8836 |
| | | | 257/194 |
| 2009/0057737 A1 * | 3/2009 | Boescke | H01L 29/40111 |
| | | | 257/295 |
| 2010/0252867 A1 * | 10/2010 | Park | H01L 29/78391 |
| | | | 257/272 |
| 2011/0169070 A1 * | 7/2011 | Osabe | H01L 29/42332 |
| | | | 257/E27.06 |
| 2012/0292677 A1 * | 11/2012 | Dubourdieu | H01L 29/42316 |
| | | | 257/295 |
| 2015/0014813 A1 * | 1/2015 | Mueller | H01L 29/94 |
| | | | 257/532 |
| 2015/0364566 A1 * | 12/2015 | Liu | H01L 29/7831 |
| | | | 438/197 |
| 2017/0141235 A1 * | 5/2017 | Lai | H01L 29/6684 |
| 2017/0162587 A1 * | 6/2017 | Chavan | H10D 30/701 |
| 2017/0345831 A1 * | 11/2017 | Chavan | H01L 28/60 |
| 2017/0365719 A1 * | 12/2017 | Chen | H01L 21/0228 |
| 2018/0166453 A1 * | 6/2018 | Müller | H10D 1/692 |
| 2018/0240804 A1 * | 8/2018 | Yoo | H01L 21/28088 |
| 2018/0350940 A1 * | 12/2018 | Yoo | H01L 29/78391 |
| 2018/0366476 A1 | 12/2018 | Liu | |
| 2019/0057860 A1 | 2/2019 | Yoon et al. | |
| 2019/0074295 A1 * | 3/2019 | Schröder | H10B 41/46 |
| 2019/0131382 A1 * | 5/2019 | Lu | H01L 29/66795 |
| 2019/0131420 A1 * | 5/2019 | Lu | H01L 29/40111 |
| 2019/0187087 A1 * | 6/2019 | Cao | G01N 31/221 |
| 2019/0189627 A1 * | 6/2019 | Pandey | H01L 29/78391 |
| 2019/0207035 A1 * | 7/2019 | Chen | H10B 51/30 |
| 2019/0348539 A1 * | 11/2019 | Yoo | H01L 29/516 |
| 2020/0105898 A1 * | 4/2020 | Hsu | H01L 29/517 |
| 2020/0176610 A1 * | 6/2020 | Lee | H01L 21/022 |
| 2021/0036024 A1 | 2/2021 | Kim et al. | |
| 2021/0083121 A1 | 3/2021 | Heo et al. | |
| 2021/0091227 A1 | 3/2021 | Heo et al. | |
| 2021/0098595 A1 | 4/2021 | Lee et al. | |
| 2021/0098596 A1 | 4/2021 | Jo et al. | |
| 2021/0118990 A1 * | 4/2021 | Jo | H01L 29/4236 |
| 2021/0193811 A1 * | 6/2021 | Moon | H01L 21/02181 |
| 2021/0280720 A1 * | 9/2021 | Lee | H10B 51/40 |
| 2021/0296465 A1 | 9/2021 | Moon et al. | |
| 2021/0359101 A1 | 11/2021 | Heo et al. | |
| 2021/0375930 A1 * | 12/2021 | Lu | H10B 51/20 |
| 2022/0238690 A1 * | 7/2022 | Chen | H10D 1/692 |
| 2023/0049651 A1 * | 2/2023 | Sun | H10D 64/689 |

FOREIGN PATENT DOCUMENTS

| | | |
|---|---|---|
| JP | 6149222 B2 | 6/2017 |
| KR | 10-2021-0047592 A | 4/2021 |
| KR | 10-2021-0081180 A | 7/2021 |

OTHER PUBLICATIONS

M.H. Park, et al. "A comprehensive study on the structural evolution of HfO2 thin films doped with various dopants," Journal of Materials Chemistry C, vol. 00, 1-3, pp. 1-16 (2013).
Muller, et al. "Ferroelectricity in Simple Binary ZrO2 and HfO2," Nano Letters, American Chemical Society, No. 12, pp. 4318-4323 (2012).
Hoffmann, et al. "Unveiling the double-well energy landscape in a ferroelectric layer," Nature, pp. 1-12 (2019).
Iniguez, et al. "Ferroelectric negative capacitance," Nature Reviews, pp. 1-14 (2019).
Lee, et al. "Unveiling the Origin of Robust Ferroelectricity in Sub-2 nm Hafnium Zirconium Oxide Films," Applied Materials, ACS Applied Matters, Interfaces, vol. 13, 36499-36506 (2021).

* cited by examiner

THIN FILM STRUCTURE AND SEMICONDUCTOR DEVICE COMPRISING THE SAME

CROSS-REFERENCE TO RELATED APPLICATIONS

This application is based on and claims priority under 35 U.S.C. § 119 to Korean Patent Application Nos. 10-2020-0146371 and 10-2021-0035345, filed on Nov. 4, 2020 and Mar. 18, 2021, in the Korean Intellectual Property Office, the disclosures of each of which are incorporated by reference herein in their entirety.

BACKGROUND

Some example embodiments relate to a thin film structure and a semiconductor device including the same.

Ferroelectrics are materials with ferroelectricity and maintain spontaneous polarization by aligning internal electric dipole moments even when an external electric field is not applied thereto. For example, ferroelectrics are materials in which polarization (or electric field) remains semi-permanently even when a certain voltage is applied thereto and then again the voltage returns to 0V. Research has been made to improve the performance of devices by applying such ferroelectric characteristics to semiconductor devices. For example, research has been conducted to apply characteristics of polarization values of ferroelectrics showing hysteresis with respect to a voltage change to memory devices from the past.

Recently, research results have been published on the possibility that ferroelectrics may have negative capacitance in a specific operating region, and when the negative capacitance is applied to transistors, subthreshold swings may fall below 60 mV/dec, which is the theoretical limit of silicon-based transistors of the related art. For this reason, research has been made to utilize ferroelectrics in low-power semiconductor devices.

Furthermore, fluorite-based materials, such as hafnium-based oxides, may have ferroelectricity, and thus, research has been conducted to use fluorite-based materials in semiconductor devices. Hafnium-based oxides are expected to be useful for reduction/miniaturization of semiconductor devices because hafnium-based oxides may be friendly to semiconductor processing and/or have ferroelectricity even in thin films of a very small thickness of several nm.

SUMMARY

Provided are a thin film structure including a fluorite-based material layer in which ferroelectricity and stability are simultaneously improved/secured, and/or a semiconductor device including the same.

Alternatively or additionally, provided are a thin film structure including a fluorite-based material layer disposed on a substrate and including crystals of which <112> crystal orientation is aligned in a normal direction of the substrate, and a semiconductor device including the same.

Additional aspects will be set forth in part in the description which follows and, in part, will be apparent from the description, or may be learned by practice of example embodiments.

According to some example embodiments, a thin film structure includes a substrate, and a material layer on the substrate, the material having a fluorite structure and including crystals of which <112> crystal orientation is aligned in a normal direction of the substrate.

The fluorite-based material layer may include the crystals of which the <112> crystal orientation is aligned in the normal direction of the substrate among all crystals of the material in a dominant ratio. For example, crystals of which the <112> crystal orientation is aligned may be greater than or equal to 20%, greater than or equal to 25%, greater than or equal to 30%, greater than or equal to 40%, greater than or equal to 45%, equal to or less than 90%, equal to or less than 85%, equal to or less than 80%, equal to or less than 75%, equal to or less than 70%, equal to or less than 65%, equal to or less than 60%, or equal to or less than 55% among the total crystals.

The fluorite-based material layer may include a material expressed by $MO_2X_\delta$ (where M is Hf and/or Zr, X is O, N, and/or H, and $0 \leq \delta \leq 1$). Alternatively or additionally, the fluorite-based material layer may include a material expressed by $MO_2X_\delta$ (where M is Hf and/or Zr, X is O, N, and/or H, and $0 \leq \delta \leq 1$) as a base material and may further include one or more dopant materials selected from the group consisting of or including C, Si, Ge, Sn, Pb, Al, Y, La, Gd, Mg, Ca, Sr, Ba, Ti, and combinations thereof.

The fluorite-based material layer may include a $MO_2X_\delta$ material having a ratio δ of an element X greater than 0. For example, the fluorite-based material layer may have a ratio of the element X inside the layer different from a ratio of the element X in one or more surface layers. For example, the inside of the fluorite-based material layer may include an $MO_2$ material and one or more surface layers may include a material expressed by $MO_2X_\delta$ (where M is Hf, Zr or combinations thereof, X is an element selected from the group consisting of or including O, N, and H, and $\delta_2 > 0$).

According to some example embodiments, a semiconductor device includes a first electrode and a second electrode spaced apart from the first electrode, wherein the fluorite-based material layer is disposed between the first electrode and the second electrode.

The fluorite-based material layer may include crystals of which <112> crystal orientation is aligned in a normal direction of one of the first electrode and the second electrode.

One of the first electrode or the second electrode may include a semiconductor material.

The semiconductor device may include at least one of a capacitor, a field effect transistor, etc.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The above and other aspects, features, and/or advantages of some example embodiments will be more apparent from the following description taken in conjunction with the accompanying drawings, in which.

DETAILED DESCRIPTION OF EXAMPLE EMBODIMENTS

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

In the following description, terms are used only for explaining certain example embodiments while not limiting the scope of the present disclosure. When an element is referred to as being "above" or "on" another element, it may be directly on an upper, lower, left, or right side of the other element while making contact with the other element or may be above an upper, lower, left, or right side of the other element without making contact with the other element.

The terms of a singular form may include plural forms unless otherwise mentioned. Unless otherwise mentioned, the terms "comprises" and/or "comprising" used herein specify the presence of stated features, numbers, steps, processes, elements, components, materials, or combinations thereof but do not preclude the presence or addition of one or more other features, numbers, steps, processes, elements, components, materials, or combinations thereof.

Although terms such as "first," "second," and "third" are used to describe various elements, the terms are only used to distinguish one element from other elements, and the features of the elements such as order and type should not be limited by the terms. In addition, terms such as "unit," "means," "module," or "portion" may be used to denote a unit of a comprehensive structure that has at least one function or operation and is implemented with hardware, software, or a combination of hardware and software.

Hereinafter, some example embodiments will be described with reference to the accompanying drawings. In the drawings, like reference numerals refer to like elements, and the sizes of elements (such as the widths and thicknesses of layers or regions) may be exaggerated for clarity of illustration. Example embodiments described herein are for illustrative purposes only, and various modifications may be made therein.

According to some example embodiments, a thin film structure including a ferroelectrics layer may be provided.

As described above, when ferroelectrics are applied to/included in or on a gate stack of a field effect transistor, the ferroelectrics may have negative capacitance in a specific operation region, thereby reducing a sub-threshold swing (SS). Therefore, there is a demand or desire for a method of increasing the ferroelectricity of ferroelectrics. A fluorite structure includes or corresponds to a structure for a compound of the form MX2, where M occupies sites of a face-centered cubic structure, and X occupy eight tetrahedral interstitial sites.

According to some example embodiments, ferroelectrics having a fluorite structure, or fluorite-based ferroelectrics with improved ferroelectricity and/or a thin film structure including the same may be provided by controlling a crystal phase of a fluorite-based material.

For example, the fluorite-based material such as hafnium-based oxide may have ferroelectricity in an orthorhombic crystal structure, and a crystal orientation alignment of a crystal phase, e.g. a polycrystalline phase, may have a great influence on the ferroelectricity of ferroelectrics. For example, when the crystal orientation alignment of the crystal phase is random, an effective polarization P$_{eff}$ of fluorite-based ferroelectrics with respect to an electric field direction is about 50%, whereas when the crystal phase is aligned in a <001> crystal orientation, a spontaneous polarization direction coincides with the electric field direction. Thus the effective polarization P$_{eff}$ of fluorite-based ferroelectrics with respect to the electric field direction may be close to 100%.

Alternatively or additionally, the crystal orientation of ferroelectrics may also be strongly related to the stability of materials. For example, the crystal phase aligned in the <001> crystal orientation may be very unstable, which makes maintaining the crystal structure difficult. In this case, maintaining the spontaneous polarization characteristic of ferroelectrics may be difficult, and durability of the device may significantly deteriorate.

Accordingly, the thin film structure according to some example embodiments may include ferroelectrics in which a crystal orientation of the crystal phase is aligned in the <112> orientation.

Figure 1:
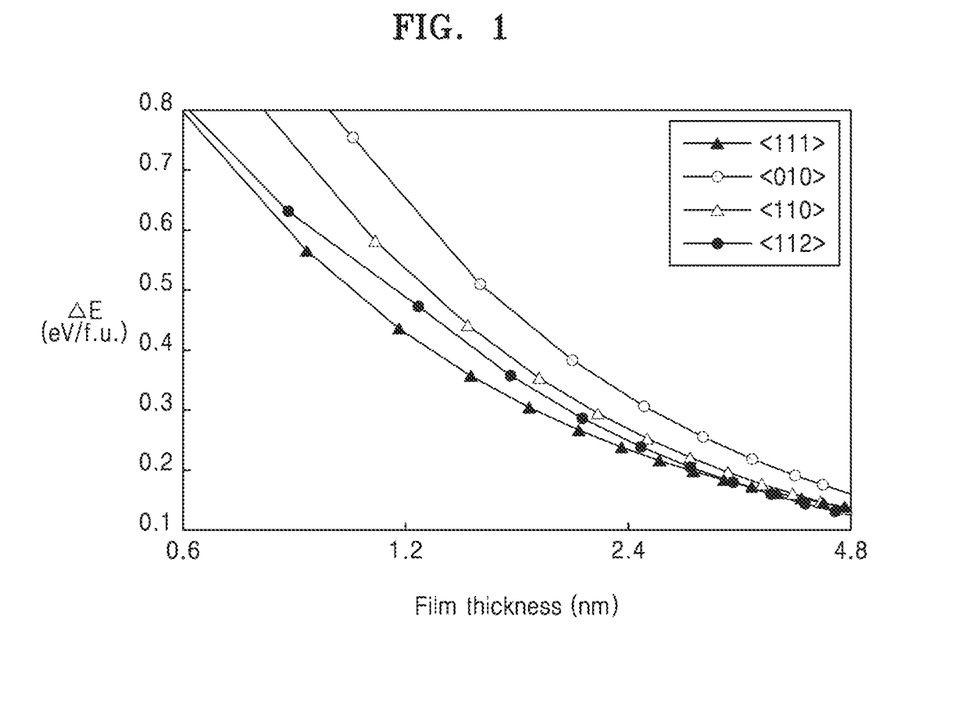
FIG. 1 is a graph of formation energy calculated according to a crystal orientation of hafnium oxide ($HfO_2$) having an orthorhombic crystal phase through a density functional theory (DFT)

FIG. 1 is a graph of formation energy calculated according to a crystal orientation of ferroelectrics (hafnium oxide having an orthorhombic crystal phase) through a density functional theory (DFT) modeling or calculation. <111>, <010>, <110>, and <112> shown in FIG. 1 represent Miller indices indicating a crystal orientation in an orthorhombic crystal structure.

Referring to FIG. 1, the formation energy in the <111> and <112> crystal orientations may be observed to be the lowest of the four orientations discussed, and may have high stability. In addition, this tendency appears to be more pronounced as a thickness of the ferroelectrics (e.g. the hafnium oxide) decreases.

Figure 2:
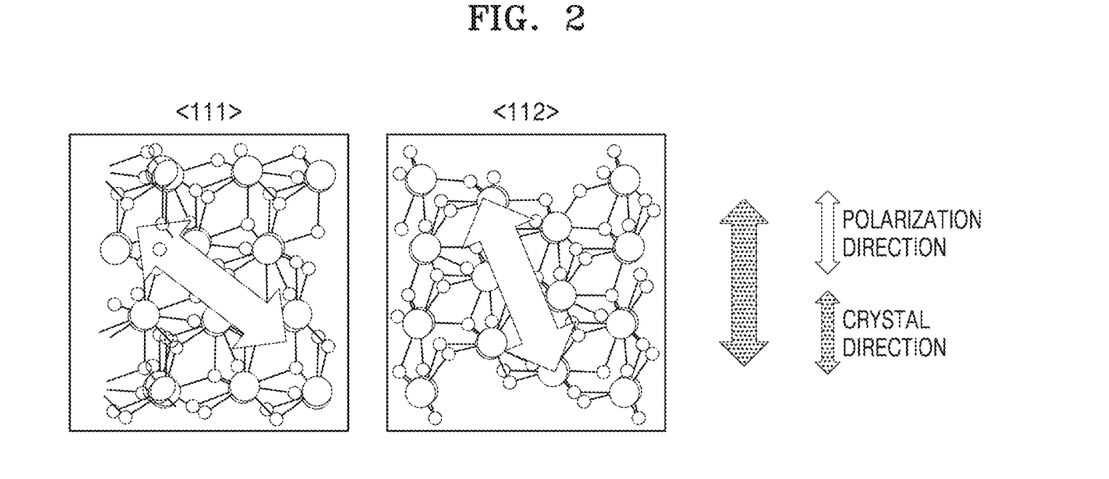
FIG. 2 is a schematic diagram showing <111> and <112> crystal orientations of hafnium oxide ($HfO_2$) having an orthorhombic crystal phase.

FIG. 2 is a schematic diagram showing <111> and <112> crystal orientations of hafnium oxide ($HfO_2$) having an orthorhombic crystal phase. According to FIG. 2, because the <111> and <112> crystal orientations respectively have angles of about 55 degrees and about 35 degrees respectively with respect to a polarization direction, when the crystal phase is aligned in the <112> crystal orientation, ferroelectrics (e.g. hafnium oxide having the orthorhombic crystal phase) may have a higher effective polarization $P_{eff}$ than when the crystal phase is aligned in the <111> crystal orientation.

Accordingly, according to some example embodiments, a thin film structure including a fluorite-based material layer disposed or placed or deposited on a substrate and including grains or crystals of which <112> crystal orientation is aligned in a direction perpendicular to a surface of the substrate, e.g. in normal direction of the substrate may have high ferroelectricity and high stability at the same time. The thin film structure may include grains and/or crystals of which the <112> crystal orientation is aligned in a normal direction of a substrate 100 as a dominant ratio (e.g. the largest or higher ratio among crystals, or wherein crystals of which the <112> orientation has the plurality of orientations among all orientations) among the total crystal orientations of a fluorite-based material layer 200. For example, of all crystals or grains having different orientations, crystals of which <112> crystal orientation is aligned may be greater than or equal to 20%, greater than or equal to 25%, greater than or equal to 30%, greater than or equal to 40%, greater than or equal to 45%, less than or equal to 90%, less than or equal to 85%, less than or equal to 80%, less than or equal to 75%, less than or equal to 70%, less than or equal to 65%, less than or equal to 60%, or less than or equal to 55% among the total crystals or total grains, as measured by volume and/or area for example. There may not be another dielectric between the electrode 300 and the channel 110. For example, the fluorite-based material layer 200 may serve as or be the dielectric layer between the electrode 300 and the channel 110. However, example embodiments are not limited thereto.

The ratio of such crystals or grains may be determined by various methods, for example but not limited to transmission electron microscopy (TEM) and/or x-ray diffraction (XRD) and/or directional reflectance microscopy (DRM) and/or precision x-ray diffraction (PED).

The fluorite-based material layer may include a material expressed by $MO_2X_\delta$ (where M is Hf and/or Zr, X is O, N, and/or H, and $0 \leq \delta \leq 1$). Alternatively or additionally, the fluorite-based material layer may include the material expressed by $MO_2X_\delta$ (where M is Hf and/or Zr, X is O, N, and/or H, and $0 \leq \delta \leq 1$) as a base material and may further include one or more dopant materials selected from the group consisting of or including C, Si, Ge, Sn, Pb, Al, Y, La, Gd, Mg, Ca, Sr, Ba, Ti, and combinations thereof. The content of dopant material may be greater than 0 at %, greater than or equal to 0.2 at %, greater than or equal to 0.5 at %, greater than or equal to 1 at %, greater than or equal to 2 at %, greater than or equal to 3 at %, less than or equal to 20 at %, less than or equal to 15 at %, less than or equal to 12 at %, less than or equal to 10 at %, less than or equal to 8 at %, less than or equal to 7 at %, and less than or equal to 6 at % compared to a metal element of the base material. Such a metal oxide may exhibit ferroelectricity even in a very thin or very small thin film of several nm or tens of Angstroms, and may be applied to the existing silicon-based semiconductor device process, and thus has a high mass production.

The fluorite-based material layer may include the $MO_2X_\delta$ material having a ratio $\delta$ of an element X greater than 0. Referring back to FIG. 1, in $MO_2$ ($\delta=0$, for example, $HfO_2$), the formation energy in the <112> crystal orientation is greater than that in the <111> crystal orientation. However, this stability of the fluorite-based material layer may vary through surface control.

Figure 3A:
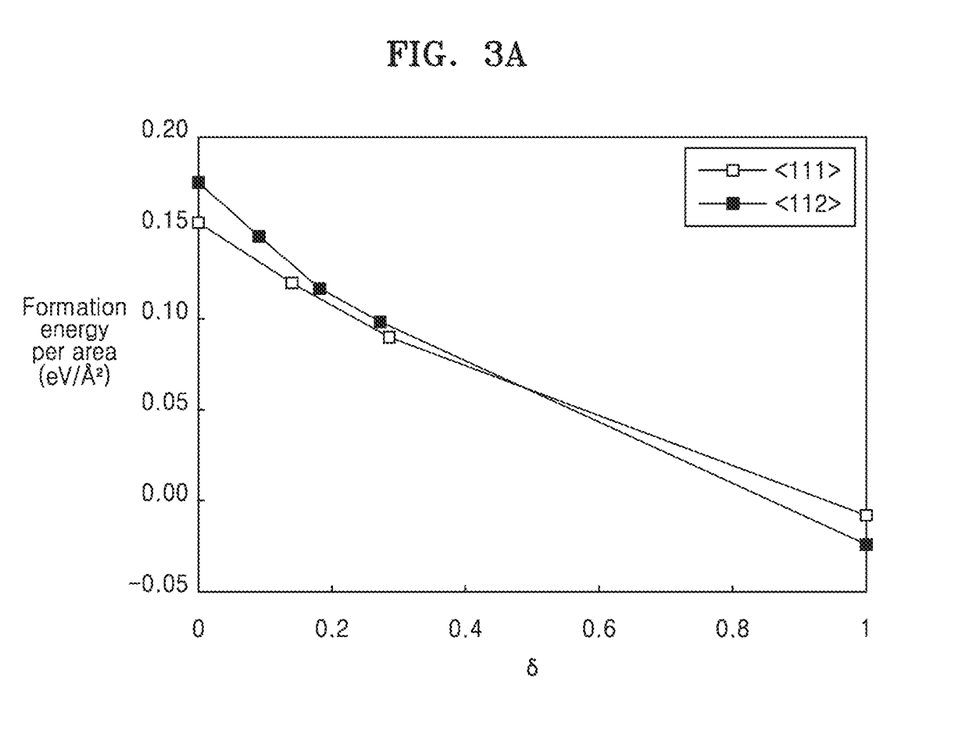
FIG. 3A is a graph of formation energy calculated according to <111> and <112> crystal orientations and a ratio of an element X with respect to hafnium oxide (HfO$_2$X$_\delta$) having an orthorhombic crystal phase through a DFT.
Figure 3B:
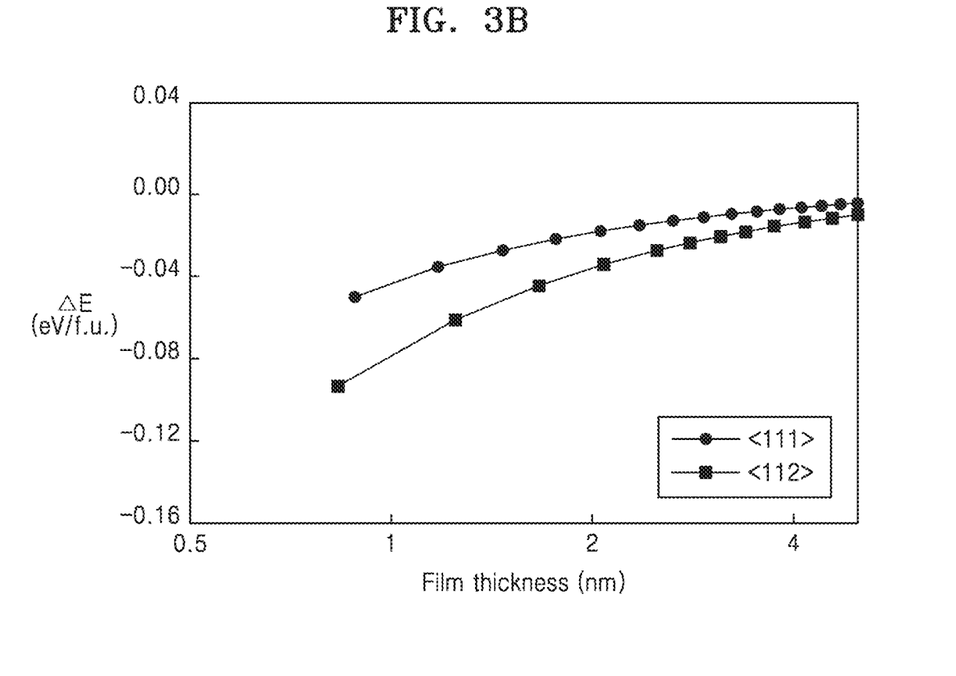
FIG. 3B is a graph of formation energy calculated according to <111> and <112> crystal orientations and thickness with respect to hafnium oxide (HfO$_2$X$_\delta$, 0<δ<1) having an orthorhombic crystal phase through a DFT.

FIG. 3A is a graph of formation energy calculated according to the ratio $\delta$ of an element X of hafnium oxide ($HfO_2X_\delta$, for example, X is oxygen) having an orthorhombic crystal phase through a DFT. Referring to FIG. 3A, as the ratio $\delta$ of the element X (oxygen) increases, the formation energy of $HfO_2X_\delta$ decreases, and when the ratio $\delta$ of the element X is equal to greater than 0.1, the formation energy in the <112> crystal orientation may be similar to or less than the formation energy in the <111> crystal orientation. Accordingly, a fluorite-based material layer according to some example embodiments may simultaneously secure or improve ferroelectricity and material stability because an inside of the layer and one or more surface layers may have different ratios of the element X. For example, a ratio ($\delta_1$, $0 \leq \delta < 1$) of the element X of the inside of the layer may be smaller than a ratio ($\delta 2$, $0 < \delta \leq 1$) of the element X of the one or more surface layers. For example, the ratio $\delta_1$ of the element X of the inside of/within the layer is 0, and the ratio $\delta_1$ fits stoichiometricily, and thus the fluorite-based material layer may maintain ferroelectricity. The ratio $\delta 2$ of the element X of the one or more surface layers is greater than 0, and anions exceed compared to stoichiometry, and thus the fluorite-based material layer may secure or improve material stability. For example, the entire fluorite-based material layer may be a compound expressed by $MO_2X_\delta$ ($0 < \delta < 1$), and may be a compound having one or more surface layers expressed by $MO_2X_{\delta 2}$ ($\delta_2$ is equal to or greater than 0.1, greater than or equal to 0.15, greater than or equal to 0.2, greater than or equal to 0.25, greater than or equal to 0.3, greater than or equal to 0.35, greater than or equal to 0.4, equal to or less than 1.0, equal to or less than 0.95, or equal to or less than 0.9). According to some example embodiments, as a result of calculating the formation energy of the material layer $HfO_2X_\delta$ ($0 < \delta < 1$) in which the ratio $\delta 2$ of the element X of the one or more surface layers is 1 through the DFT, the formation energy in the <112> crystal orientation is found to be less than the formation energy in the <111> crystal orientation regardless of the thickness (FIG. 3B).

Alternatively or additionally, the fluorite-based material layer may include the orthorhombic crystal phase. For example, the fluorite-based material layer may include various crystal phases such as the orthorhombic crystal phase and a tetragonal crystal phase, but may include the orthorhombic crystal phase as a dominant component (e.g. the largest or higher ratio of all crystal phases included in the fluorite-based material layer). A crystal phase distribution may be determined for example, by at least one of transmission electron microscopy (TEM), grazing Incidence X-ray diffraction (GIXRD), etc.

According to some example embodiments, a semiconductor device including the aforementioned thin film structure may be provided. The semiconductor device may be or may include a memory device and/or a non-memory device, and may be, for example, at least one of a field effect transistor, a capacitor, or a combination structure thereof, but example embodiments are not limited thereto.

Figure 4:
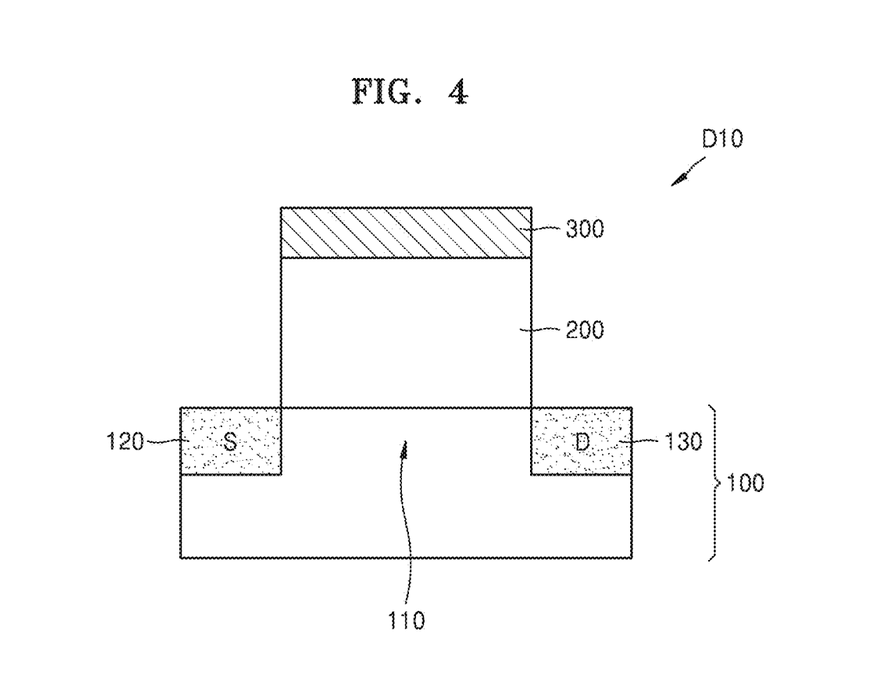
FIGS. 4 to 6 are schematic diagrams illustrating semiconductor devices (field effect transistors) according to some example embodiments.
Figure 5:
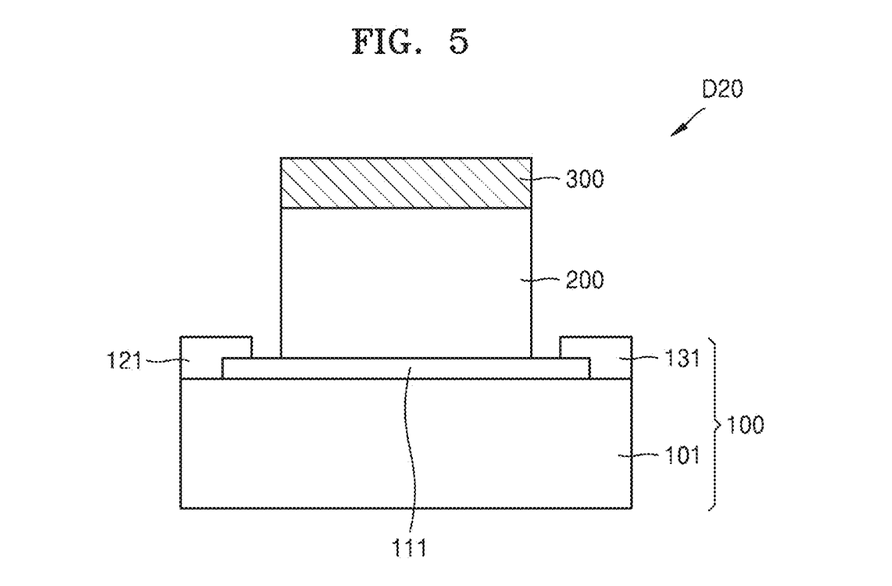

FIGS. 4 and 5 are schematic diagrams illustrating field effect transistors D10 and D20 according to some example embodiments. Referring to FIGS. 4 and 5, the field effect transistors D10 and D20 include a substrate 100. The substrate 100 may include portions including sources 120 or raised sources 121 and drains 130 or raised drains 131, a gate electrode 300 disposed on the substrate 100, and a fluorite-based material layer 200 disposed between the substrate 100 and the gate electrode 300 and including crystals of which <112> crystal orientation is aligned in a normal direction of the substrate 100, perpendicular to a surface of the substrate 100. The field effect transistors D10 and D20 may be or may include logic switching devices. The logic switching device is a concept contrasted with a memory device (e.g. a memory transistor), may have a non-memory characteristic, and may be or may correspond to a non-memory ON/OFF switching device.

The substrate 100 may include a semiconductor material. For example, the substrate 100 may include Si, Ge, SiGe, an III-V group semiconductor, etc., and may be modified and/or used in various forms such as silicon on insulator (SOI). The substrate 100 may be doped, e.g. may be lightly doped with boron; however, example embodiments are not limited thereto The substrate 100 may include the sources 120 and/or the raised sources 121 and the drains 130 and/or the raised drains 131, and may include channels 110 and 111 electrically connected to the sources 120/raised sources 121 with the drains 130/raised drains 131. The sources 120 and raised sources 121 may be electrically connected to or contact one end of the channels 110 and 111, and the drains 130 and 131 may be electrically connected or contact the other end of the channels 110 and 111.

Referring to FIG. 4, the channel 110 may be defined as a substrate region between the source 120 and the drain 130 in the substrate 100. The source 120 and the drain 130 may be formed by doping or incorporating impurities, such as by implanting impurities, such as at least one of boron, phosphorus, or arsenic, into different regions of the substrate 100. In this case, the source 120, the channel 110, and the drain 130 may include a substrate material as a base material.

Alternatively or additionally, referring to FIG. 5, the channel 111 may be implemented as a material layer (a thin film) separate from a substrate region 101. The material composition of the channel 111 may vary. For example, the channel 111 may include not only a semiconductor material such as Si, Ge, SiGe, group III-V, etc., but also at least one selected from the group consisting of or including an oxide semiconductor, a nitride semiconductor, an oxynitride semiconductor, a two-dimensional (2D) material, a quantum dot, an organic semiconductor, and combinations thereof. For example, the oxide semiconductor may include InGaZnO, etc., the 2D material may include transition metal dichalcogenide (TMD) or graphene, and the quantum dot may include colloidal QD, nanocrystal structure, etc. Alternatively or additionally, the raised source 121 and the raised drain 131 may include a conductive material, and, for example, each may independently include a metal, a metal compound, or a conductive polymer.

Alternatively or additionally, the raised source 121 and the raised drain 131 may be an epitaxial layer, and may be formed epitaxially on top of the substrate 100. Impurities may be included/incorporated during an epitaxial growth of either or both of the raised source 121 and the raised drain 131; however, example embodiments are not limited thereto.

The gate electrode 300 may be disposed on the substrate 100 and may be spaced apart from the substrate 100, and may be disposed to face the channels 110 and 111. The gate electrode 300 may have conductivity or sheet resistance equal to or less than approximately 1 Mohm/square. The gate electrode 300 may include at least one selected from the group consisting of or including metal, metal nitride, metal carbide, polysilicon, and combinations thereof. For example, the metal may include aluminum (Al), tungsten (W), molybdenum (Mo), titanium (Ti), or tantalum (Ta), a metal nitride film may include a titanium nitride (TiN) film or a tantalum nitride (TaN) film, and the metal carbide may be an aluminum or silicon-doped (or containing) metal carbide, and may include, for example, TiAlC, TaAlC, TiSiC, or TaSiC. The gate electrode 300 may have a structure in which a plurality of materials are stacked. For example, the gate electrode 300 may have a stack structure of a metal nitride layer/metal layer such as TiN/Al, and/or a stack structure of a metal nitride layer/metal carbide layer/metal layer such as TiN/TiAlC/W. The gate electrode 300 may include a titanium nitride film (TiN) or molybdenum (Mo), and the above example may be used in various modifications.

The fluorite-based material layer 200 may be disposed between the substrate 100 and the gate electrode 300. For example, the fluorite-based material layer 200 may be formed on either or both of the channels 110 and 111.

The fluorite-based material layer 200 may have a thickness greater than 0 nm and less than or equal to 20 nm. For example, the thickness of the fluorite-based material layer 200 may be greater than 0 nm, equal to or greater than 0.1 nm, greater than or equal to 0.2 nm, greater than or equal to 0.3 nm, greater than or equal to 0.4 nm, greater than or equal to 0.5 nm, greater than or equal to 0.6 nm, greater than or equal to 0.7 nm, greater than or equal to 0.8 nm, greater than or equal to 1.0 nm, or greater than or equal to 1.5 nm, less than or equal to 20 nm, less than or equal to 18 nm, less than or equal to 15 nm, less than or equal to 12 nm, less than or equal to 10 nm, less than or equal to 8 nm, less than or equal to 6 nm, less than or equal to 5 nm, less than or equal to 4 nm, less than or equal to 3 nm, less than or equal to 2 nm, or less than or equal to 1 nm. The thickness may be measured according to one or more methods, and for example, an ellipsometer (SE MG-1000, Nano View) and/or a transmission electron microscope (TEM) may be used.

Figure 6:
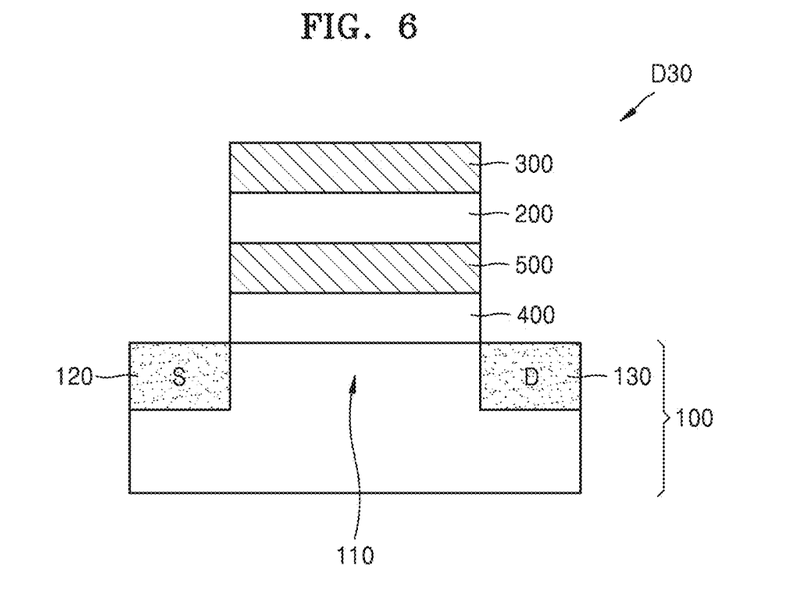

FIG. 6 is a schematic diagram illustrating a semiconductor device D30 (a field effect transistor) according to another embodiment. Referring to FIG. 6, a dielectric layer 400 may be further included between the channel 110 and the thin film structure 200. The dielectric layer 400 may suppress or prevent electrical leakage. The thickness of the dielectric layer 400 may be greater than or equal to 0.1 nm, greater than or equal to 0.3 nm, or greater than or equal to 0.5 nm, and may be less than or equal to 5 nm, less than or equal to 4 nm, less than or equal to 3 nm, less than or equal to 2 nm, or less than or equal to 1 nm. The dielectric layer 400 may include a paraelectric material or a high-k dielectric material, and may include silicon oxide, silicon nitride, aluminum oxide, hafnium oxide, zirconium oxide, etc. or may include a 2D insulator such as hexagonal boron (h-BN). For example, the dielectric layer 400 may include silicon oxide ($SiO_2$), silicon nitride ($SiN_x$), etc. In addition, the dielectric layer 400 may include hafnium oxide ($HfO_2$), hafnium silicon oxide ($HfSiO_4$), lanthanum oxide ($La_2O_3$), lanthanum aluminum oxide (LaAlO$_3$), zirconium oxide (ZrO$_2$), zirconium silicon oxide (ZrSiO$_4$), tantalum oxide (Ta$_2$O$_5$), titanium oxide (TiO$_2$), strontium titanium oxide (SrTiO$_3$), yttrium oxide (Y$_2$O$_3$), aluminum oxide (Al$_2$O$_3$), red scandium tantalum oxide (PbSc$_{0.5}$Ta$_{0.5}$O$_3$), red zinc niobate (PbZnNbO$_3$), etc. Alternatively or additionally, the dielectric layer 400 may include metal nitride oxide such as at least one of aluminum oxynitride (AlON), zirconium oxynitride (ZrON), hafnium oxynitride (HfON), lanthanum oxynitride (LaON), yttrium oxynitride (YON), etc., silicate such as ZrSiON, HfSiON, YSiON, LaSiON, etc., aluminate such as ZrAlON, HfAlON, etc.

Referring to FIG. 6, a conductive layer 500 may be further included between the channel 110 and the thin film structure 200. The conductive layer 500 may have conductivity or sheet resistance less than or equal to about 1 Mohm/square. The conductive layer 500 may be a floating electrode, and may include metal or a metal compound.

The field effect transistor may be implemented in various forms such as 2-dimension and 3-dimension. For example, the field effect transistor may be of a 1-gate on channel such as a planar-FET, a 3-gate on channel type such as a fin-FET, or a 4-gate on channel type such as a gate-all-around-FET.

Figure 7:
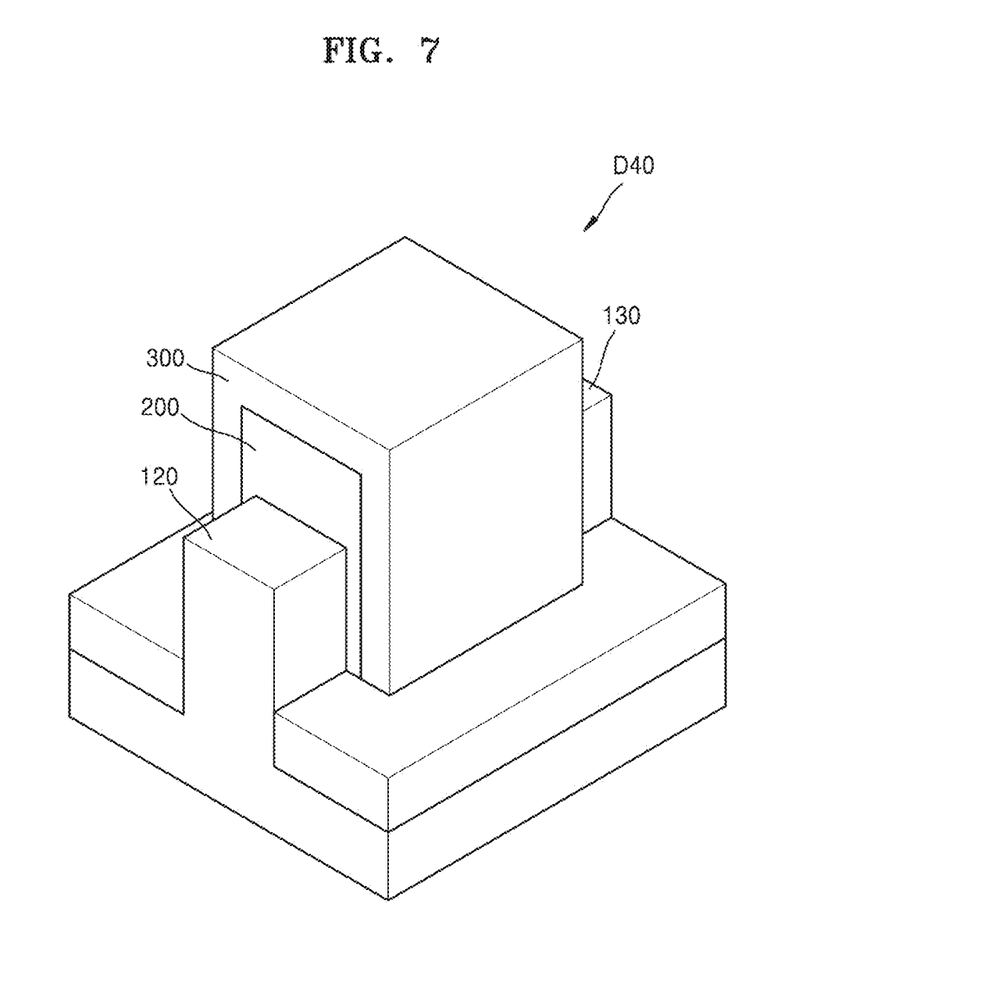
FIGS. 7 and 8 are schematic diagrams showing semiconductor devices (field effect transistors) according to some example embodiments.

FIG. 7 is a schematic diagram showing a semiconductor device (e.g., a fin-FET) D40 according to another embodiment. Referring to FIG. 7, the fin-FET D40 may include the source 120, the drain 130, and the channel (110 in FIG. 4 or 111 in FIG. 5) defined as a region therebetween, and the channels 110 and 111 may have a fin shape. The gate electrode 300 may be disposed on the substrate 100 having the fin shape so as to cross the fin shape. The channel 110 or 111 may be formed in a region where the fin shape and the gate electrode 300 cross each other. The fluorite-based material layer 200 may be disposed between the channel 110 or 111 and the gate electrode 300 so as to surround the channel 110 or 111.

Figure 8:
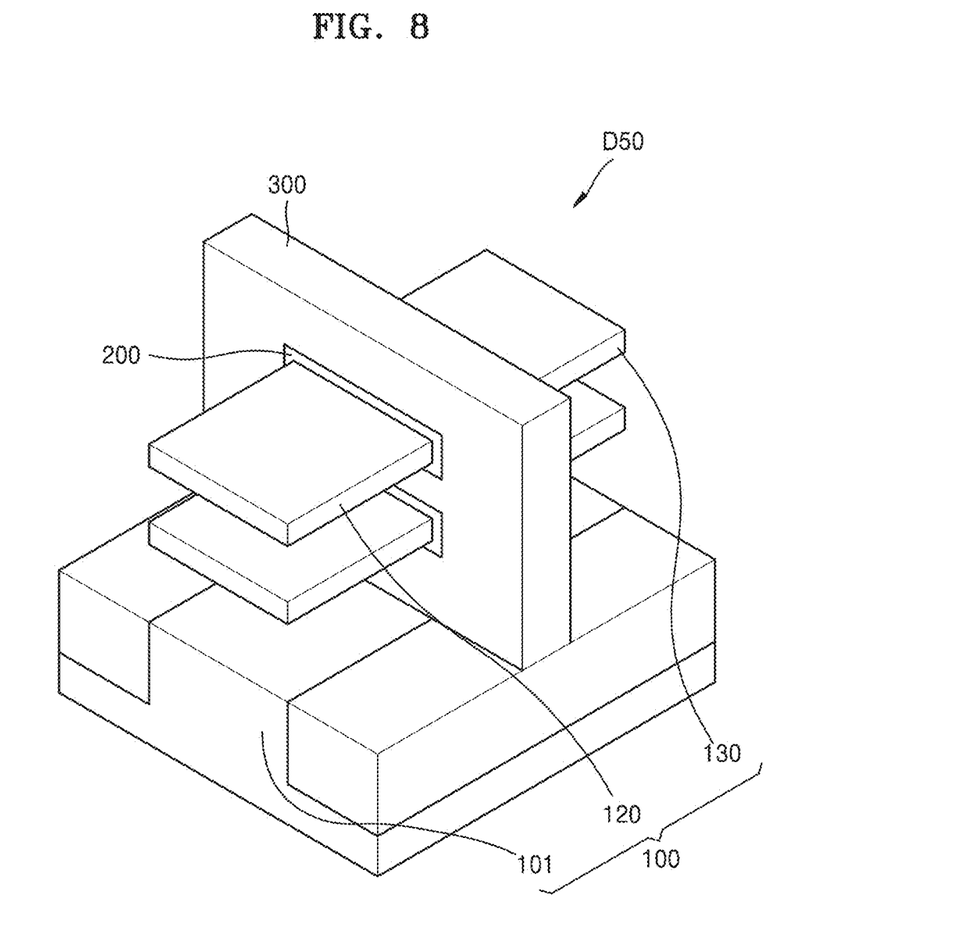

FIG. 8 is a schematic diagram showing a semiconductor device (e.g., a gate-all-around-FET) D50 according to another embodiment. Referring to FIG. 8, the gate-all-around-FET D50 may include the source 120, the drain 130, and the channel (110 in FIG. 4 or 111 in FIG. 5) defined as a region therebetween, and the channels 110 and 111 may have a shape such as a wire or a sheet. The source 120, the drain 130, and the channels 110 and 111 may be disposed to be spaced apart from the substrate region 101. The gate electrode 300 may be disposed to surround the source 120, the drain 130, and the channel 110 or 111 while intersecting the source 120, the drain 130, and the channel 110 or 111. The channel 110 or 111 may be formed in a region surrounding the gate electrode 300. For example, the fluorite-based material layer 200 may be disposed between the channel 110 or 111 and the gate electrode 300 to surround the channel 110 or 111.

Figure 9:
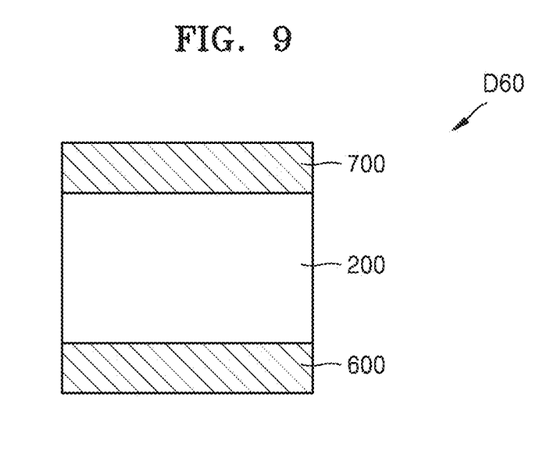
FIG. 9 is a schematic diagram showing a semiconductor device (a capacitor) according to some example embodiments.

FIG. 9 is a schematic diagram showing a capacitor D60 according to some example embodiments. The capacitor D60 may have a non-linear profile; for example, the capacitor D60 may have a hysteresis profile; however, example embodiments are not limited thereto.

Referring to FIG. 9, the capacitor D60 may include a first electrode 600, a second electrode 700 facing and spaced apart from the first electrode 600, and the fluorite-based material layer 200 disposed between the first electrode 600 and the second electrode 700. The first electrode 600 and the second electrode 700 may be referred to as a lower electrode and an upper electrode, respectively.

The first electrode 600 and the second electrode 700 may have conductivity or sheet resistance less than or equal to approximately 1 Mohm/square, and may include the same material or different materials. For example, each of the first electrode 600 and the second electrode 700 may independently include at least one of TiN, TaN, Ti, Ta, TiCN, TiSiN, WSiN, TiAlN, TaAlN, TiAlCN, TiW, RuTiN, RuCN, Pt, Au, Mo or Al. As a specific example, each of the first electrode 600 and the second electrode 700 may independently include TiN or Mo. The thickness of the first electrode 600 and the second electrode 700 may be greater than or equal to about 1 nm and less than or equal to about 20 nm, and may be the same or different from one another.

The capacitor D60 may or may not exhibit a substantially hysteresis behavior. For example, the capacitor D60 may have a coercive electric field less than or equal to approximately 1 MV/cm in a change in polarization according to an external electric field.

The above-described thin film structure and a semiconductor device including the same may be manufactured by forming an amorphous layer including a material that will have a fluorite-structure in a crystalline, e.g. a polycrystalline phase. The material may have a desired composition on a substrate.

The amorphous layer may be annealed, e.g. may be annealed after a certain time has elapsed after deposition. The annealing may be according to a specific (or, alternatively, predetermined) temperature for a specific (or, alternatively, predetermined) time). The annealing may be performed with a rapid thermal annealing (RTP) process and/or with a furnace process and/or with a laser thermal annealing (LTA) process; however, example embodiments are not limited thereto.

Through annealing, the amorphous layer may be crystallized, e.g. may form polycrystalline grains, so that the <112> crystal orientation is aligned perpendicular to a surface of the substrate, e.g. in a normal direction of a substrate.

The amorphous layer may be formed by one or more methods. For example, at least one of atomic layer deposition (ALD), chemical vapor deposition (CVD), physical vapor deposition (PVD), sputtering, etc. may be used. The ALD method may have an advantage that a more uniform layer may be formed in atomic units and/or may be performed at a relatively low temperature.

When the amorphous layer is formed through the ALD method, a hafnium source, a zirconium source, and an oxygen source may be use general precursors. For example, as the hafnium source, at least one selected from the group consisting of or including Hf(OtBu)$_4$, Tetrakis Ethyl Methyl Amino Hafnium (TEMAH), Tetrakis Di-Methyl Amino Hafnium (TDMAH), Tetrakis Di-Ethyl Amino Hafnium (TDEAH), and combinations thereof may be used, but is not limited thereto. In addition, as the zirconium source, at least one selected from the group consisting of or including Zr(OtBu)$_4$, Tetrakis Ethyl Methyl Amino Zirconium (TEMAZ), Tetrakis Di-Methyl Amino Zirconium (TDMAZ), Tetrakis Di-Ethyl Amino Zirconium (TDEAZ), and combinations thereof may be used, but is not limited thereto. Alternatively or additionally, as the oxygen source, at least one selected from the group consisting of or including O$_3$, H$_2$O, O$_2$, N$_2$O, O$_2$ plasma, and combinations thereof may be used, but is not limited thereto.

In an annealing operation, all of or at least one of temperature, time, and atmosphere must be or may be controlled so that the fluorite-based amorphous layer is crystallized to have an orthorhombic crystal phase, and at least a plurality of crystal grains, e.g. a majority of crystal grains have the <112> crystal orientation aligned in the normal direction of the substrate. A thermal budget of the annealing operation may be determined in consideration of the composition and/or thickness of the fluorite-based amorphous layer. For example, the annealing operation may be performed two or more times. For example, the annealing operation may include a post deposition annealing operation of first annealing the amorphous layer, an operation of forming an electrode thereon, and a post metal annealing operation of second annealing the amorphous layer and the electrode.

Annealing may be performed at a temperature of 400° C. to 1100° C., but example embodiments are not limited thereto. Annealing may be performed for a time period greater than or equal to 1 nano-second, greater than or equal to 1 micro-second, greater than or equal to 0.001 second, greater than or equal to 0.01 second, greater than or equal to 0.05 second, greater than or equal to 0.1 second, greater than or equal to 0.5 second, greater than or equal to 1 second, greater than or equal to 3 seconds, or greater than or equal to 5 seconds, and less than or equal to 10 minutes, less than or equal to 5 minutes, less than or equal to 1 minute, or less than or equal to 30 seconds, but example embodiments are not limited thereto. For example, the first annealing operation may be performed at a lower temperature and/or for a shorter time than the second annealing operation. The atmosphere in which the annealing is performed is not particularly limited. For example, the first annealing operation may be performed under an atmosphere of at least one of $H_2O$, $O_2$, $O_3$, $N_2$, $H_2$, and/or $NH_3$.

The capacitor D60 and the field effect transistor may be manufactured or fabricated using the method of manufacturing the thin film structure described above. For example, the capacitor D60 may be manufactured by using a substrate including a first electrode having conductivity, and as described above, forming a fluorite-based amorphous layer on the substrate, then performing a post deposition annealing operation, forming an electrode thereon, and then performing a post metal annealing. The field effect transistor may be manufactured by using a method similar to the method of manufacturing the capacitor described above, except that a substrate including a semiconductor material is used and a gate electrode is formed instead of a second electrode. When manufacturing/fabricating the field effect transistor, an operation of forming a dielectric layer on a substrate including a semiconductor material may be further included, and an operation of forming a source and a drain on the substrate including the semiconductor material may be further included.

Figure 10:
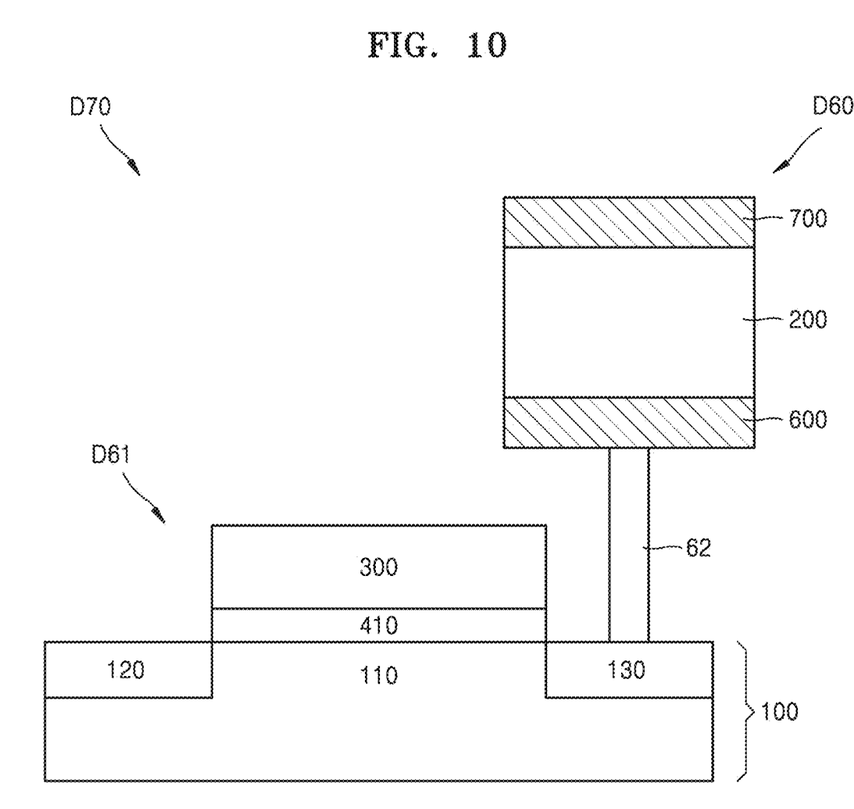
FIG. 10 is a schematic diagram illustrating a semiconductor device (a connection structure of a capacitor and a field effect transistor) according to some example embodiments.

According to some example embodiments, a semiconductor device including the above-described thin film structure and/or semiconductor device may be provided. The semiconductor device may include a plurality of other electrical circuits/other semiconductor devices, and may be in a form in which the field effect transistor and the capacitor are electrically connected. The semiconductor device may have memory characteristics, and may be, for example, DRAM that may or may not be refreshed. For example, the memory may be non-volatile; however, example embodiments are not limited thereto. FIG. 10 is a schematic diagram illustrating a semiconductor device D70 (a connection structure of the capacitor D60 and a field effect transistor D61) according to some example embodiments. Referring to FIG. 10, the semiconductor device D70 may have a structure in which the capacitor D60 including a ferroelectric layer and an antiferroelectric layer and the field effect transistor D61 are electrically connected by a contact 62. For example, one of the electrodes 600 and 700 of the capacitor D60 and one of the source/drain 120 and 130 of the transistor D61 may be electrically connected by the contact 62. The contact 62 may include an appropriate conductive material, such as at least one of tungsten, copper, aluminum, doped or undoped polysilicon, etc.

The field effect transistor D61 may include the substrate 100 including the source 120, the drain 130, and the channel 110, and the gate electrode 300 disposed to face the channel 110. A dielectric layer 410 may be further included between the substrate 100 and the gate electrode 300. The field effect transistor D61 of FIG. 10 does not include the thin film structure 200, but may instead or also include the fluorite-based material layer 200 as shown in FIG. 1. The source 120, the drain 130, the channel 110, the substrate 100, and the gate electrode 300 may be the same as described above, and the dielectric layer 410 may refer to the description of the dielectric layer 400 described above.

The arrangement of the capacitor D60 and the field effect transistor D61 may be variously modified. For example, the capacitor D60 may be disposed on the substrate 100 or may be buried in the substrate 100.

Semiconductor devices and/or semiconductor apparatuses may be applied to various electronic devices. For example, the field effect transistor, capacitor, or a combination thereof described above may be applied as a logic device and/or a memory device in various electronic devices. The semiconductor device according to some example embodiments may have advantages in terms of at least one of efficiency, speed, and power consumption, and thus may meet or partially meet or exceed the demand/expectation for miniaturization and/or integration of electronic devices. For example, semiconductor devices and semiconductor apparatuses may be used for arithmetic operations, program execution, temporary data retention, etc. in electronic devices such as mobile devices, computers, notebook computers, sensors, network devices, neuromorphic devices, etc. The semiconductor devices and/or semiconductor apparatus according to some example embodiments may be useful for electronic devices in which an amount of data transmission is large and data transmission is continuously performed.

Figure 11:
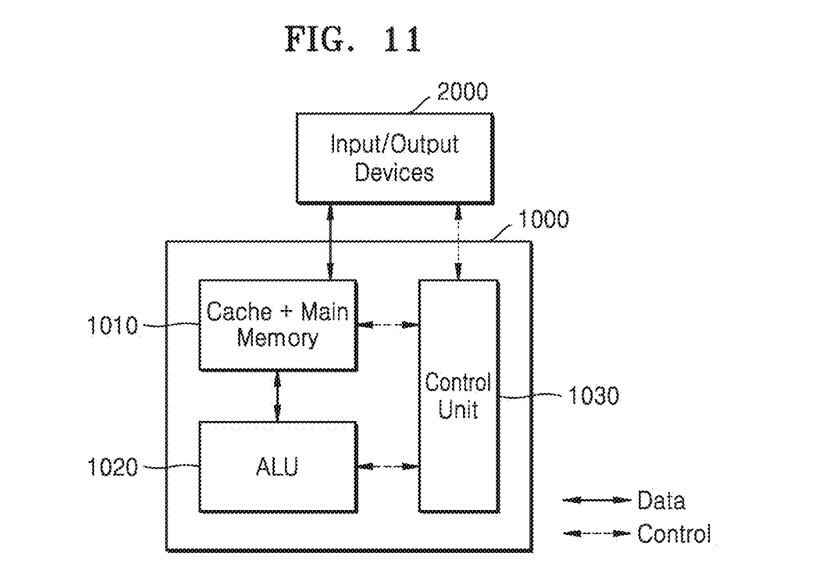
FIGS. 11 and 12 are conceptual diagrams schematically showing an electronic device architecture applicable to an electronic device according to some example embodiments.
Figure 12:
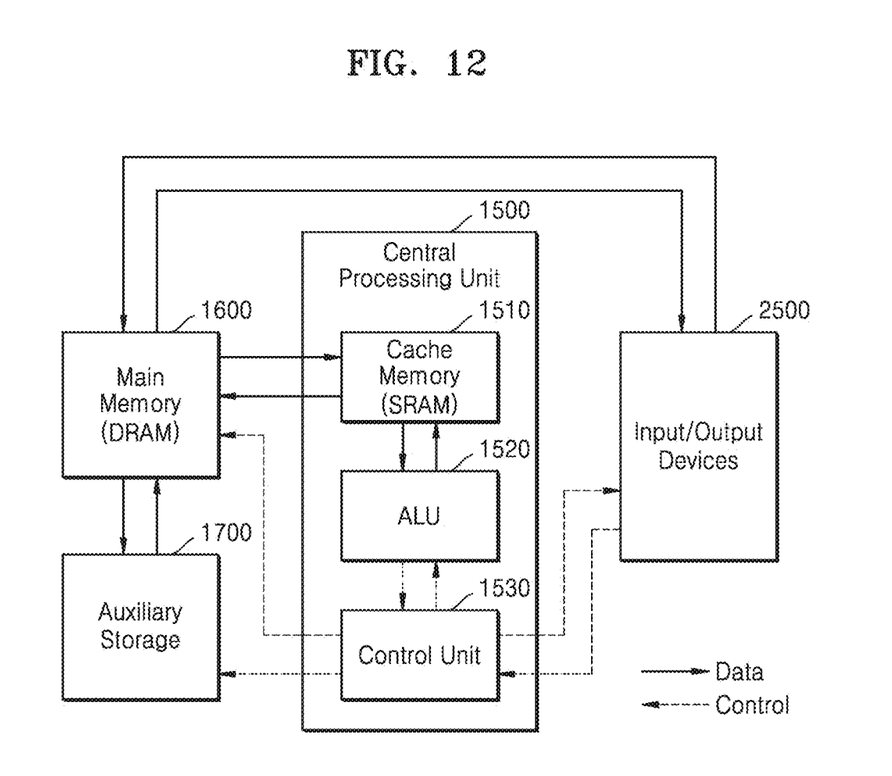

FIGS. 11 and 12 are conceptual diagrams schematically showing an electronic device architecture 1000 applicable to an electronic device according to some example embodiments.

Referring to FIG. 11, the electronic device architecture 1000 may include a memory unit 1010, an arithmetic logic unit (ALU) 1020, and a control unit 1030. The memory unit 1010, the ALU 1020, and the control unit 1030 may be electrically connected to each other. For example, the electronic device architecture 1000 may be implemented as a single chip including the memory unit 1010, the ALU 1020, and the control unit 1030. For example, the memory unit 1010, the ALU 1020, and the control unit 1030 may be connected to each other through a metal line in on-chip to communicate directly. The memory unit 1010, the ALU 1020, and the control unit 1030 may be monolithically integrated on one substrate to form a single chip. An input/output device 2000 may be connected to the electronic device architecture (chip) 1000.

The memory unit 1010, the ALU 1020, and the control unit 1030 may each independently include the aforementioned semiconductor device (a field effect transistor, a capacitor, etc.) For example, the ALU 1020 and the control unit 1030 may each independently include the field effect transistor described above, and the memory unit 1010 may be or may include the capacitor, the field effect transistor, or a combination thereof described above. The memory unit 1010 may include both a main memory and a cache memory.

The electronic device architecture (chip) 1000 may be an on-chip memory processing unit.

Referring to FIG. 12, a cache memory 1510, an ALU 1520, and a control unit 1530 may constitute a central processing unit (CPU) 1500. The cache memory 1510 may be static random access memory (SRAM), and may include the field effect transistor described above. Apart from the CPU 1500, a main memory 1600 and an auxiliary storage 1700 may be provided. The main memory 1600 may be dynamic random access memory (DRAM) and may include the capacitor described above.

In some cases, the electronic device architecture 1000 may be implemented in a form in which computing unit devices and memory unit devices are adjacent to each other on a single chip, regardless of sub-units.

Hereinafter, some example embodiments including the aforementioned thin film structure and semiconductor devices will be presented.

Embodiment 1

A polysilicon (p-Si) substrate is manufactured, and a surface thereof is partially oxidized, e.g. is oxidized in a furnace and/or is oxidized in a latent manner owing to a queuing time to form a silicon oxide layer ($SiO_2$). An amorphous $HfO_2$ layer is formed on the silicon oxide layer ($SiO_2$) through atomic layer deposition (ALD), and first annealing is performed in an $N_2$ rich atmosphere. An electrode is formed thereon through DC sputtering and/or ALD, and second annealing is performed. TiN and/or Mo is used as the electrode.

Figure 13A:
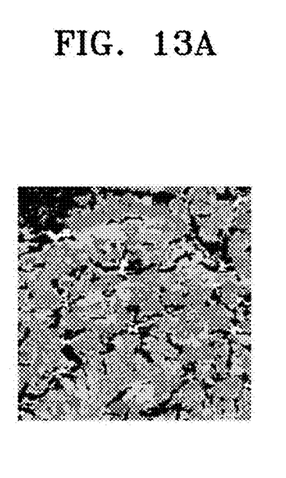
FIGS. 13A and 13B illustrate results of precession electron diffraction (PED) analysis of out-of-plane crystal orientation distributions of hafnium oxide layers manufactured according to example Embodiment 1 and Comparative Example 1.

An out-of-plane crystal orientation distribution of the manufactured hafnium oxide layer is confirmed through precession electron diffraction (PED), which is illustrated in FIG. 13A. Referring to FIG. 13A, it may be seen that the <111> crystal orientation of about 49% of the total crystals of the $HfO_2$ layer according to the embodiment is aligned in a normal direction of the substrate. That is, FIG. 13A illustrates that about 49% of the area of the perspective of the PED correspond to grains having a <111> orientation.

Comparative Example 1

A capacitor is manufactured in the same manner as in Embodiment 1, except that annealing is not performed immediately after forming the amorphous $HfO_2$ layer and prior to forming the electrode, and annealing is performed once after forming the electrode.

Figure 13B:
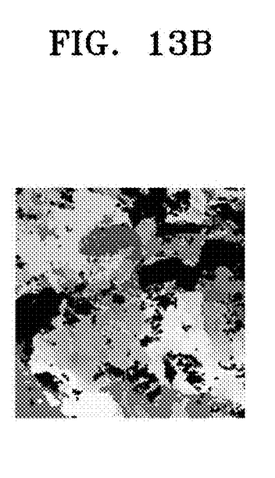
Figure 13C:
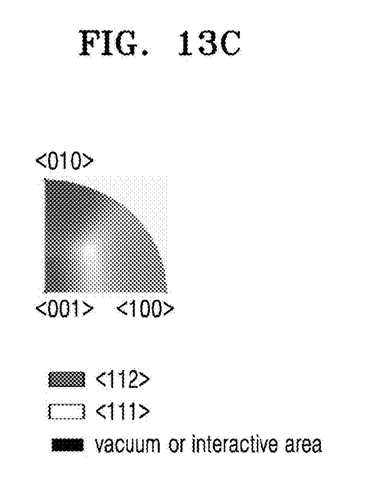
FIG. 13C illustrates a legend for FIGS. 13A and 13B.

An out-of-plane crystal orientation distribution of the manufactured $HfO_2$ layer is confirmed through PED, which is shown in FIG. 13B. Referring to FIG. 13B, it may be seen that in the $HfO_2$ layer according to Comparative Example 1, one crystal orientation is not biased, and several crystal orientations are mixed and aligned randomly.

Comparative Example 2

A capacitor is manufactured in the same manner as in Embodiment 1, except that the amorphous $HfO_2$ layer is not formed, an electrode is formed directly on the silicon oxide layer ($SiO_2$), and annealing is performed once, e.g. after forming the electrode.

Electrical Characteristics

Figure 14:
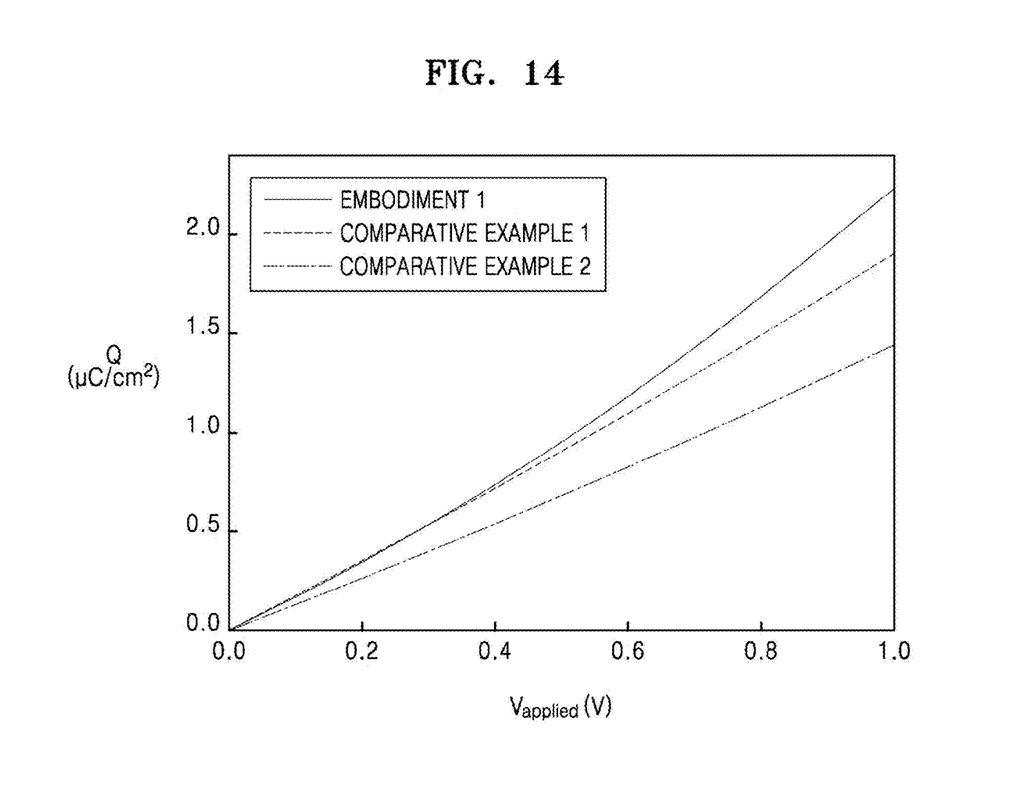
FIG. 14 is a graph showing a voltage versus charge (C-V curve) of capacitors manufactured according to example Embodiment 1, Comparative Example 1, and Comparative Example 2.

The voltage versus charge curve (C-V curve) of the capacitors of Embodiment 1, Comparative Example 1, and Comparative Example 2 is measured and shown in FIG. 14. Referring to FIG. 14, it may be seen that example Embodiment 1 has a high amount of charge under the same voltage as compared to Comparative Examples 1 and 2, and that a voltage required when inducing the same amount of charge is smaller. As described above, it may be seen that the capacitor according to the embodiment may contribute to high-speed driving and/or low power driving of an electronic device.

According to some example embodiments, a thin film structure including a fluorite-based material layer in which ferroelectricity and stability are secured at the same time may be provided. A semiconductor device having an improved capacitance, and/or a semiconductor device having an improved subthreshold swing (SS) may be provided. Such thin film structures and semiconductor device may be applicable to various electronic devices, electronic apparatuses, electronic circuits, etc.

Figure 15:
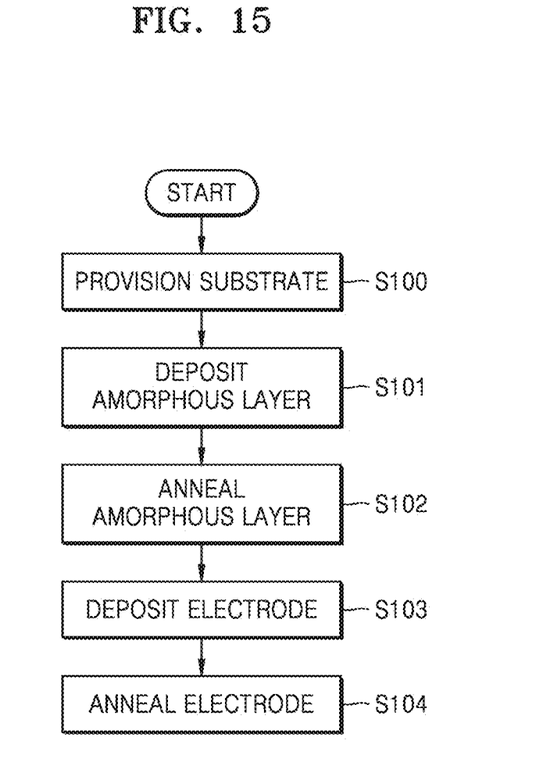
FIG. 15 illustrates a flow chart of a method of fabricating a semiconductor device, according to some example embodiments.

FIG. 15 is a flow chart of a method of forming a semiconductor device, according to some example embodiments.

Referring to FIG. 15, initially a substrate may be provisioned in step S100.

In step S101, an amorphous layer of a material may be deposited, e.g. directly deposited onto a surface of the substrate or onto a thin film of oxide formed on the substrate.

In step S102, the substrate and the amorphous layer may be annealed for a certain time at a certain temperature. During the annealing, at least a portion of the amorphous layer may begin to crystallize, e.g. may begin to crystallize into a polycrystalline fluorite structure. After the annealing least a percentage of the crystal grains may have a <112> Miller index with respect to a surface of the substrate. The amorphous layer may become a fluorite-based material layer.

In step S103, an electrode may be deposited onto the fluorite-based material layer.

In step S104, there may be another annealing process performed after the deposition of the electrode. The annealing process performed after the deposition of the electrode may have a different time, temperature, humidity, pressure, etc. than the annealing process performed before the deposition of the electrode.

After the annealing process performed in step S104, the fluorite-based material layer may have a polycrystalline structure in which a plurality of the crystal phases are in the <112> orientation with respect to a surface of the substrate.

Any of the elements and/or functional blocks disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The processing circuitry may include electrical components such as at least one of transistors, resistors, capacitors, etc. The processing circuitry may include electrical components such as logic gates including at least one of AND gates, OR gates, NAND gates, NOT gates, etc.

It should be understood that embodiments described herein should be considered in a descriptive sense only and not for purposes of limitation. Descriptions of features or aspects within each embodiment should typically be considered as available for other similar features or aspects in other embodiments. For example, none of the example embodiments are necessarily mutually exclusive with one another. While one or more example embodiments have been described with reference to the figures, it will be understood by those of ordinary skill in the art that various changes in form and details may be made therein without departing from the spirit and scope as defined by the following claims.

What is claimed is:

1. A thin film structure comprising:
a substrate; and
a material layer having a fluorite structure, the material layer on the substrate and comprising crystals of which a <112> crystal orientation is aligned in a direction normal to a surface of the substrate, the material layer comprising a material expressed by $MO_2X_\delta$ (where M is Hf, Zr or combinations of Hf and Zr, and X is an element selected from the group including O, N, and H, and $0 \leq \delta \leq 1$), the material layer having a ratio of the element X inside the material layer different from a ratio of the element X in one or more surface layers of the material layer.

2. The thin film structure of claim 1,
wherein the material layer comprises the crystals of which the <112> crystal orientation is aligned in the normal direction of the substrate among all crystals of the material layer in a dominant ratio.

3. The thin film structure of claim 1,
wherein the material layer comprises at least 20% of the crystals of which the <112> crystal orientation is aligned in the direction among all crystals of the material layer.

4. The thin film structure of claim 1,
wherein the material layer has ferroelectricity.

5. The thin film structure of claim 1,
wherein the material layer comprises a material expressed by $MO_2X_\delta$ (where M is Hf, Zr or combinations of Hf and Zr, X is an element selected from the group including O, N, and H, and $0 \leq \delta \leq 1$) as a base material, and the material layer further comprises one or more dopant materials selected from the group including of C, Si, Ge, Sn, Pb, Al, Y, La, Gd, Mg, Ca, Sr, Ba, or Ti.

6. The thin film structure of claim 5,
wherein the material layer comprises a content of the one or more dopant materials greater than 0 at % and less than or equal to 20 at % compared to a metal element of the base material.

7. The thin film structure of claim 1,
wherein the material layer comprises a material expressed by $MO_2X_\delta$ (where M is Hf, Zr or combinations of Hf and Zr, and X is an element selected from the group including O, N, and H, and $\delta>0$).

8. The thin film structure of claim 1,
wherein the ratio of the element X in the one or more surface layers of the material sface-layers. layer is greater than or equal to 0.

9. The thin film structure of claim 1,
wherein the one or more surface layers of the material layer comprises a material expressed in $MO_2X_{\delta 2}$ (where M is Hf, Zr, or combinations of Hf and Zr, X is an element selected from the group including O, N, and H, and $0.1 \leq \delta_2 \leq 0.95$).

10. The thin film structure of claim 1,
wherein the material layer has a thickness of between 0.1 nm or more and 10 nm or less.

11. The thin film structure of claim 1,
wherein the material layer has a thickness greater than or equal to 0.1 nm and less than or equal to 5 nm.

12. A semiconductor device comprising the thin film structure of claim 1.

13. The semiconductor device of claim 12, further comprising:
a first electrode; and
a second electrode apart from the first electrode,
wherein the material layer is between the first electrode and the second electrode, and
at least one of the first electrode or the second electrode corresponds to the substrate.

14. The semiconductor device of claim 13, further comprising:
a paraelectric material layer.

15. The semiconductor device of claim 14,
wherein the paraelectric material layer is between the material layer and the substrate.

16. The semiconductor device of claim 15,
wherein the paraelectric material layer comprises one or more materials selected from the group including aluminum oxide ($Al_2O_3$), lanthanum oxide ($La_2O_3$), yttrium oxide ($Y_2O_3$), and silicon oxide ($SiO_2$).

17. The semiconductor device of claim 13,
wherein one of the first electrode or the second electrode comprises a semiconductor material.

18. The semiconductor device of claim 17,
wherein the one of the first electrode or the second electrode comprising the semiconductor material comprises a source and a drain.

19. A semiconductor circuitry comprising:
the semiconductor device of claim 12; and
at least one other circuit.

20. The thin film structure of claim 1,
wherein the ratio of the element X inside the material layer is smaller than the ratio of the element X in the one or more surface layers of the material layer.

* * * * *